United States Patent
Soltani et al.

(10) Patent No.: US 11,747,704 B2
(45) Date of Patent: Sep. 5, 2023

(54) INTEGRATION OF ELECTRONICS WITH LITHIUM NIOBATE PHOTONICS

(71) Applicant: Raytheon BBN Technologies Corp., Cambridge, MA (US)

(72) Inventors: Moe Soltani, Belmont, MA (US); Jeffrey Laroche, Andover, MA (US); Thomas Kazior, Sudbury, MA (US)

(73) Assignee: Raytheon BBN Technologies Corp., Cambridge, MA (US)

( * ) Notice: Subject to any disclaimer, the term of this patent is extended or adjusted under 35 U.S.C. 154(b) by 0 days.

(21) Appl. No.: 17/731,369

(22) Filed: Apr. 28, 2022

(65) Prior Publication Data
US 2022/0252956 A1    Aug. 11, 2022

Related U.S. Application Data

(62) Division of application No. 16/859,454, filed on Apr. 27, 2020, now Pat. No. 11,340,512.

(51) Int. Cl.
| | | |
|---|---|---|
| G02F 1/225 | (2006.01) | |
| G02F 1/00 | (2006.01) | |
| G02F 1/03 | (2006.01) | |
| G02F 1/015 | (2006.01) | |

(52) U.S. Cl.
CPC ............ *G02F 1/225* (2013.01); *G02F 1/0018* (2013.01); *G02F 1/0316* (2013.01); *G02F 1/0152* (2021.01)

(58) Field of Classification Search
CPC ...... G02F 1/225; G02F 1/0018; G02F 1/0316; G02F 1/0152
See application file for complete search history.

(56) References Cited

U.S. PATENT DOCUMENTS

| | | | |
|---|---|---|---|
| 4,983,251 A * | 1/1991 | Haisma | H01L 21/2007 148/DIG. 12 |
| 6,316,793 B1 | 11/2001 | Sheppard et al. | |
| 6,486,502 B1 | 11/2002 | Sheppard et al. | |
| 6,583,454 B2 | 6/2003 | Sheppard et al. | |
| 6,962,835 B2 * | 11/2005 | Tong | B23K 20/02 257/E21.705 |
| 7,535,089 B2 * | 5/2009 | Fitzgerald | H01L 31/162 257/444 |
| 8,110,823 B2 * | 2/2012 | Bowers | H01S 5/125 257/14 |
| 8,257,990 B2 * | 9/2012 | Koch | H01S 5/02325 438/31 |

(Continued)

OTHER PUBLICATIONS

Boes et al., Status and Potential of Lithium Niobate on Insulator (LNOI) for Photonic Integrated Circuits, Laser Photonics Rev. 2018, 1700256 (Year: 2018).*

(Continued)

*Primary Examiner* — Peter Radkowski
(74) *Attorney, Agent, or Firm* — Lando & Anastasi, LLP

(57) ABSTRACT

An electro-optical modulator assembly including a transistor including a gate, a drain, and a source disposed on a substrate, a photonic modulator including a first waveguide structure positioned between a first electrode and a second electrode, the photonic modulator being integrated with the transistor on the substrate, and a metal connection coupled between the drain of the transistor and one of the first and second electrodes of the photonic modulator.

12 Claims, 11 Drawing Sheets

(56) References Cited

U.S. PATENT DOCUMENTS

| | | | | |
|---|---|---|---|---|
| 8,604,577 | B2* | 12/2013 | Koch | H01S 5/0215 |
| | | | | 257/432 |
| 8,912,017 | B2* | 12/2014 | El-Ghoroury | H01L 27/14683 |
| | | | | 438/23 |
| 9,209,068 | B2 | 12/2015 | Moriceau et al. | |
| 9,360,623 | B2* | 6/2016 | Bowers | G02B 6/131 |
| 9,431,368 | B2* | 8/2016 | Enquist | H01L 23/5384 |
| 9,470,957 | B2* | 10/2016 | Ide | G02F 1/377 |
| 9,478,508 | B1 | 10/2016 | LaRoche et al. | |
| 9,564,414 | B2* | 2/2017 | Enquist | H01L 21/8221 |
| 10,096,550 | B2 | 10/2018 | LaRoche et al. | |
| 10,366,962 | B2* | 7/2019 | Enquist | H01L 23/13 |
| 10,381,801 | B1* | 8/2019 | Liang | H01S 5/22 |
| 11,347,001 | B2* | 5/2022 | Chen | G02B 6/12002 |
| 11,442,298 | B2* | 9/2022 | Mitamura | G02F 1/065 |
| 2001/0017370 | A1 | 8/2001 | Sheppard et al. | |
| 2003/0201459 | A1 | 10/2003 | Sheppard et al. | |
| 2010/0216294 | A1* | 8/2010 | Rabarot | H01L 21/0217 |
| | | | | 257/E21.09 |
| 2011/0158278 | A1* | 6/2011 | Koch | H01S 5/0215 |
| | | | | 438/31 |
| 2012/0189317 | A1* | 7/2012 | Heck | H01S 5/021 |
| | | | | 372/45.01 |
| 2012/0288995 | A1* | 11/2012 | El-Ghoroury | H01L 33/0095 |
| | | | | 438/107 |
| 2013/0208752 | A1* | 8/2013 | Koch | H01S 5/0215 |
| | | | | 372/45.012 |
| 2015/0037044 | A1* | 2/2015 | Peterson | G02B 6/4292 |
| | | | | 398/135 |
| 2015/0194337 | A1* | 7/2015 | Moriceau | H01L 21/02164 |
| | | | | 438/455 |
| 2016/0190093 | A1* | 6/2016 | Enquist | H01L 21/6835 |
| | | | | 438/109 |
| 2017/0207600 | A1* | 7/2017 | Klamkin | H01S 5/141 |
| 2019/0004247 | A1* | 1/2019 | Huang | G02B 6/4214 |
| 2019/0346624 | A1 | 11/2019 | Soltani et al. | |
| 2020/0124879 | A1 | 4/2020 | Park et al. | |

OTHER PUBLICATIONS

Taylor et al., Demonstration of the heterostructure field-effect transistor as an optical modulator, Appl. Phys. Lett. 59, 1031 (1991); https://doi.org/10.1063/1.106335 (Year: 1991).*

Das et al., Jul. 16, 2019, A novel photonic modulator based on an AlGaN/GaN High Electron Mobility Transistor (HEMT). (Year: 2019).*

Roelkens et al., III-V/Si photonics by die-to-wafer bonding, MaterialsToday, Jul. 36-Aug. 2007 | vol. 10 | No. 7-8 (Year: 2007).*

Niklaus, Frank, Adhesive Wafer Bonding for Microelectronic and Microelectromechanical Systems, Dissertation, Royal Institute of Technology, Stockholm, Sweden, 2002 (Year: 2002).*

Park et al., InGaAsP Mach-Zehnder interferometer optical modulator monolithically integrated with InGaAs driver MOSFET on a III-V CMOS photonics platform, Opt. Express 26, 4842-4852 (2018) (Year: 2018).*

Boes, A., et al. "Status and Potential of Lithium Niobate on Insulator (LNOI) for Photonic Integrated Circuits," Laser & Photonics Reviews, (2018), 12, 1700256, pp. 1-19.

Chang, et al. "Thin Film Wavelength Converters for Photonic Integrated Circuits" Optica, (2016) vol. 3, No. 5, pp. 531-535.

International Search Report and Written Opinion in International Patent Application No. PCT/US2021/028685 dated Jul. 29, 2021.

Jin, et al. "LiNbO3 Thin-Film Modulators Using Silicon Nitride Surface Ridge Waveguides," IEEE Photonics Technology Letters, (2016) vol. 28, No. 7, pp. 736-739.

Lin, Y.C., et al. "Gallium Nitride (GaN) High-Electron-Mobility Transistors with Thick Copper Metallization Featuring a Power Density of 8.2 W/mm for Ka-Band Applications," Micromachines, (2020), 11, 222; pp. 2-11.

Mahrous, H., et al. "A compact 120 GHz monolithic silicon-on-silica electro-optic modulator," Optical and Quantum Electronics, (2020) vol. 52, No. 2, pp. 1-11.

Mercante, et al. "Thin Film Lithium Niobate Electro-Optic Modulator with Terahertz Operating Bandwidth," Optics Express, (2018) vol. 26, No. 11.

Rabiei, et al. "Heterogeneous Lithium Niobate Photonics on Silicon Substrates," Optics Express, (2013) vol. 21, No. 21, pp. 25573-25581.

Rao, et al. "Compact Lithium Niobate Electrooptic Modulators," IEEE Journal of Selected Topics in Quantum Electronics, (2018) vol. 24, No. 4.

Rao, et al., "High-Performance and Linear Thin-Film Lithium Niobate Mach-Zehnder Modulators on Silicon up to 50 GHz," Optics Letters, (2016) vol. 41, No. 24, pp. 5700-5703.

Wang, et al. "Nanophotonic Lithium Niobate Electro-optic Modulators." Optics Express, (2018) vol. 26, No. 2, pp. 1547-1555.

Wang, et al."Integrated Lithium Niobate Electro-Optic Modulators Operating at CMOS-Compatible Voltages," Nature, (2018) vol. 562, pp. 101-104.

* cited by examiner

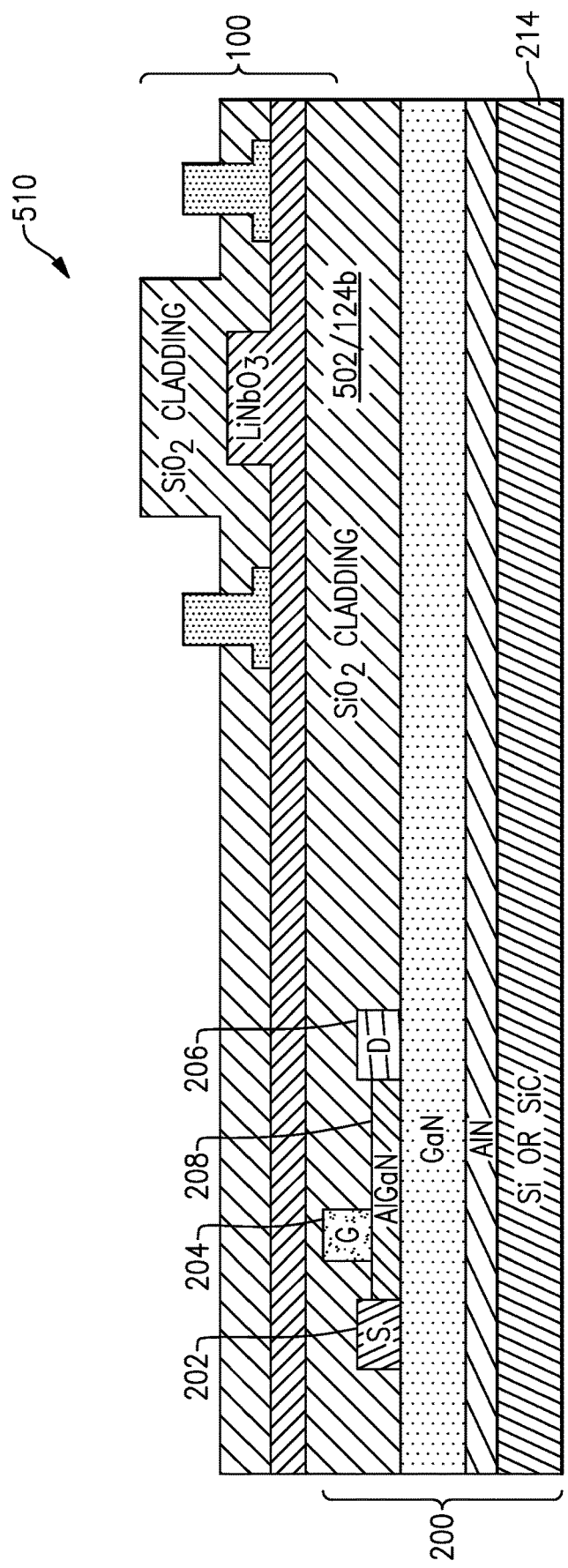

INTEGRATION OF ELECTRONICS WITH LITHIUM NIOBATE PHOTONICS

CROSS-REFERENCE TO RELATED APPLICATIONS

This application claims priority under 35 U.S.C. § 121 as a division of U.S. patent application Ser. No. 16/859,454, titled "INTEGRATION OF ELECTRONICS WITH LITHIUM NIOBATE PHOTONICS," filed Apr. 27, 2020, the entire contents of which being incorporated herein by reference for all purposes.

BACKGROUND

1. Field of Invention

Embodiments of the invention relate generally to photonic modulators and more particularly photonic modulators for converting signals carrying information in the radio frequency (RF) energy domain to signals carrying the information in the optical frequency energy domain.

2. Discussion of Related Art

As is known in the art, photonic, or electro-optic, modulators have been used to convert radio frequency (RF) energy to optical energy. Some types of photonic modulators include a waveguide structure disposed between cladding layers used to confine optical energy (e.g., from a laser) introduced into one end of the waveguide structure and then passing through the waveguide structure to a detector. One type of waveguide structure includes Lithium Niobate waveguide material which is among the most promising material for modulator devices. Due to ever-increasing performance requirements, at higher modulation frequencies (e.g., 100 GHz and above) there has been a demand to miniaturize or shorten modulators and associated electronic driving circuits to enable wider frequency bandwidth and lower RF parasitic effects, where the latter can degrade performance of the modulator.

SUMMARY

One aspect of the present disclosure is directed to an electro-optical modulator assembly including a transistor including a gate, a drain, and a source disposed on a substrate, a photonic modulator including a first waveguide structure positioned between a first electrode and a second electrode, the photonic modulator being integrated with the transistor on the substrate, and a metal connection coupled between the drain of the transistor and one of the first and second electrodes of the photonic modulator.

In one embodiment, a first oxide layer disposed on a top side of the transistor is bonded to a second oxide layer disposed on a bottom side of the photonic modulator. In some embodiments, the transistor is arranged in proximity to the photonic modulator to minimize a length of the metal connection and enable operation of the photonic modulator at frequencies above 100 GHz. In certain embodiments, the transistor is a III-Nitride transistor. In one embodiment, the transistor is a Gallium Nitride (GaN) High-Electron-Mobility Transistor (HEMT).

In some embodiments, the substrate is one of a Silicon (Si) substrate and a Silicon Carbide (SiC) substrate. In certain embodiments, the photonic modulator is configured as a Mach-Zehnder interferometer (MZI) modulator and includes a second waveguide structure positioned outside the first and second electrodes. In one embodiment, the first and second waveguide structures are fabricated from at least one of Lithium Niobate ($LiNbO_3$) and Silicon Nitride (SiN) and configured to propagate an optical energy signal.

In various embodiments, the transistor is configured to receive a radio-frequency signal at the gate and to provide a modulation voltage to one of the first and second electrodes via the metal connection to induce a phase shift in the optical energy signal of the first waveguide structure. In some embodiments, the optical energy signal of the first waveguide structure is combined with the optical energy signal of the second waveguide structure to provide an optical signal having an amplitude modulation corresponding to the radio-frequency signal received at the gate of the transistor.

Another aspect of the present invention is directed to a method of manufacturing an electro-optical modulator assembly. The method includes providing a transistor including a gate, a drain, and a source disposed on a first substrate, providing a photonic modulator including a first waveguide structure positioned between a first electrode and a second electrode, the photonic modulator being disposed on a second substrate, depositing a first oxide layer over the gate, the drain, and the source of the transistor, and bonding the first oxide layer of the transistor to a second oxide layer of the photonic modulator such that the photonic modulator is integrated with the transistor on the first substrate.

In one embodiment, bonding the first oxide layer of the transistor to the second oxide layer of the photonic modulator incudes removing the second substrate to expose the second oxide layer of the photonic modulator. In some embodiments, the second substrate is removed using plasma processing and/or a back-grinding process. In certain embodiments, bonding the first oxide layer of the transistor to the second oxide layer of the photonic modulator incudes depositing the second oxide layer on a bottom side of the second substrate.

In some embodiments, the method includes removing a portion of the first oxide layer to expose the gate, the drain, and the source of the transistor, and providing a metal connection between the transistor and the photonic modulator to couple the drain of the transistor to one of the first and second electrodes of the photonic modulator. In certain embodiments, the portion of the first oxide layer is removed using a lithography process and/or an etching process. In various embodiments, the metal connection is provided between the transistor and the photonic modulator using a lithography process and/or a metal lift-off process.

In one embodiment, the transistor is a III-Nitride transistor. In some embodiments, the transistor is a Gallium Nitride (GaN) High-Electron-Mobility Transistor (HEMT). In certain embodiments, the first substrate is one of a Silicon (Si) substrate and a Silicon Carbide (SiC) substrate. In various embodiments, the photonic modulator is configured as a Mach-Zehnder interferometer (MZI) modulator and includes a second waveguide structure positioned outside the first and second electrodes. In some embodiments, the first and second waveguide structures are fabricated from at least one of Lithium Niobate ($LiNbO_3$) and Silicon Nitride (SiN) and configured to propagate optical energy.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 5C is a diagram illustrating a cross-sectional view of a III-Nitride electronic device integrated with a photonic modulator according to one embodiment;

DETAILED DESCRIPTION

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 1A:
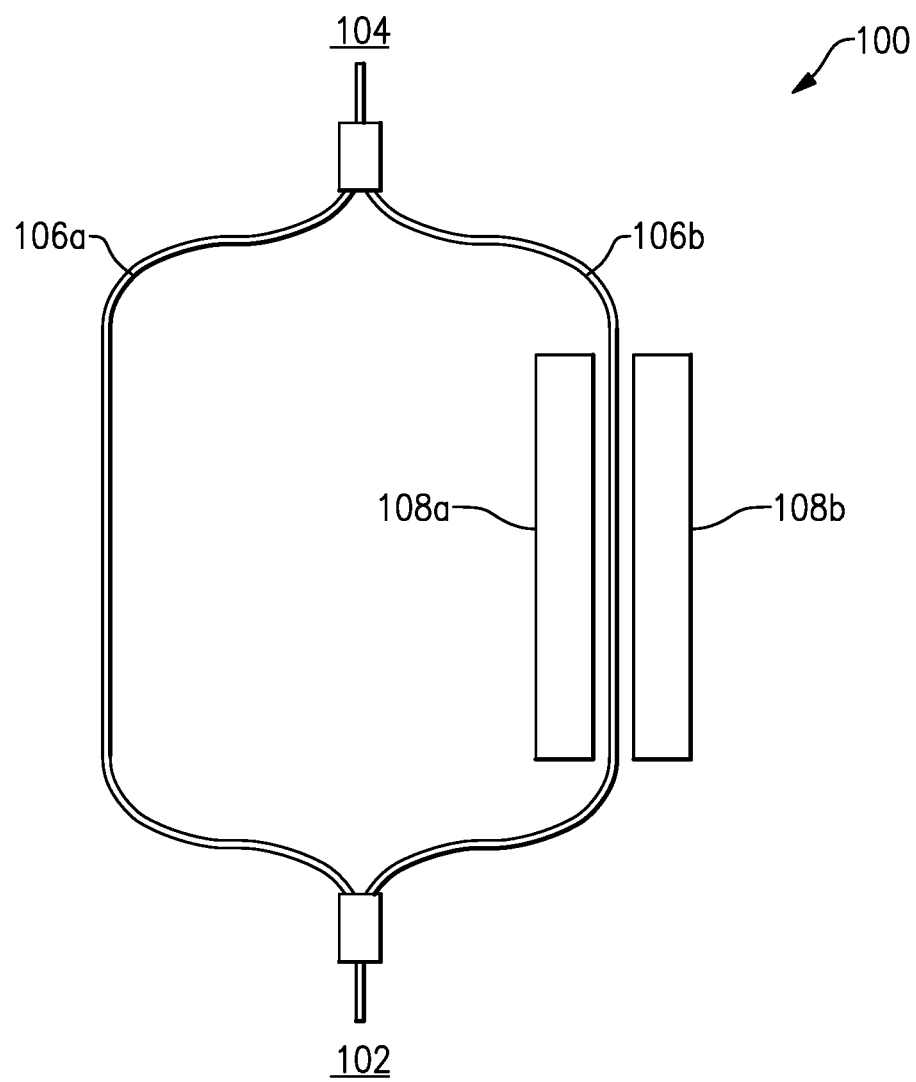
FIG. 1A is a diagram illustrating a top-down view of a photonic modulator.

As discussed above, photonic modulators can be used to convert RF energy signals into optical energy signals. In some cases, photonic modulators may utilize waveguide structures including different photonic materials integrated with Lithium Niobate (LiNbO$_3$) to provide improved performance. For example, FIG. 1A illustrates a diagram of a Mach-Zehnder interferometer (MZI) modulator 100. The modulator 100 includes an input 102, an output 104, a waveguide structure 106a, 106b (referred to collectively herein as waveguide structure 106), a first electrode 108a, and a second electrode 108b. In one example, the waveguide structure 106 may include a first arm 106a and a second arm 106b. An optical energy signal (e.g., from a laser) may be provided to the input 102 and split between the two arms 106a, 106b. The arms 106a, 106b may allow the optical energy signal to propagate from the input 102 to the output 104. A modulation voltage may be applied to the first electrode 108a and/or the second electrode 108b to induce a phase shift in the optical energy signal of the second arm 106b (i.e., the modulating arm). In some examples, a modulation voltage may also be applied to third and fourth electrodes (not shown) to induce a phase shift in the optical energy signal of the first arm 106a. In some examples, the modulation voltage applied to the electrode(s) may correspond to information carried by an RF energy signal. The optical energy signals of the first and second arms 106a, 106b may constructively and/or de-constructively combine to produce output optical energy having an amplitude modulation corresponding to the information carried by the RF energy signal.

Figure 1B:
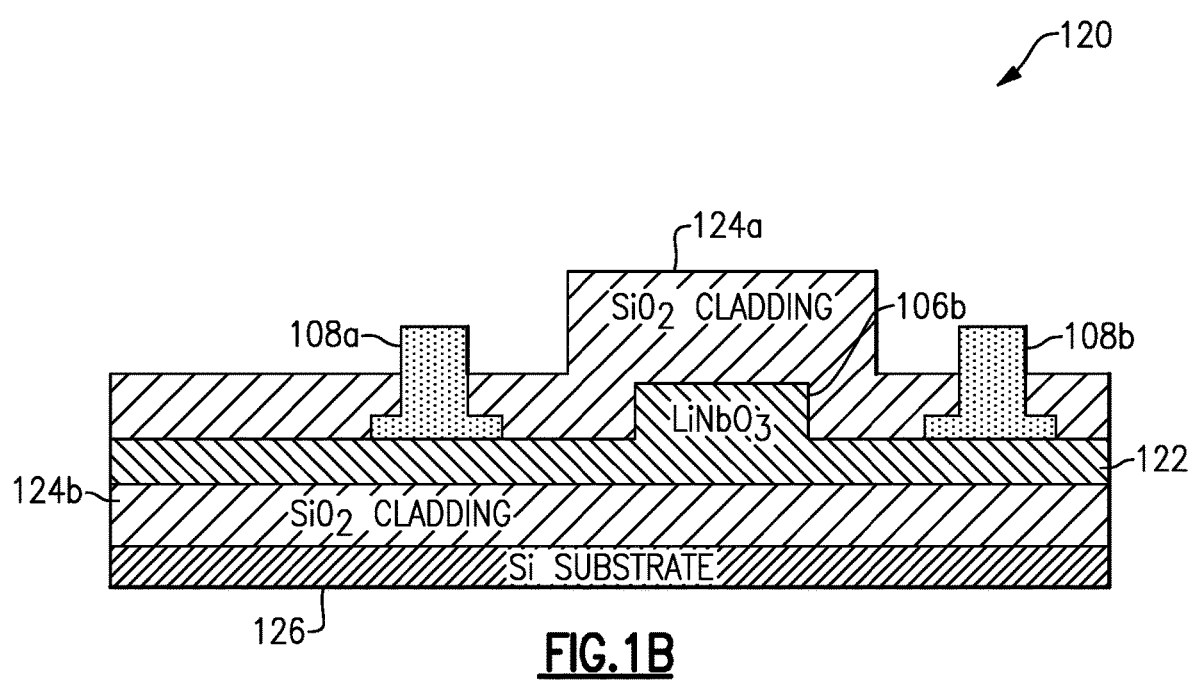
FIG. 1B is a diagram illustrating a cross-sectional view of a photonic modulator.

FIG. 1B illustrates a cross sectional view of a modulation section 120 of an MZI modulator. In one example, the modulation section 120 may correspond to the electrodes 108a, 108b, and the waveguide structure of the second arm 106b of the modulator 100 of FIG. 1A. As shown, the waveguide structure of the second arm 106b may be defined by directly patterning a slab of Lithium Niobate (LiNbO$_3$) material 122. The waveguide structure of the second arm 106b is surrounded by Silicon Dioxide (SiO$_2$) cladding layers 124a, 124b. The electrodes 108a, 108b may be fixed to the slab of LiNbO$_3$ material 122 and partially covered by the SiO$_2$ cladding layer 124a. In some examples, the waveguide structure of the second arm 106b, the slab of LiNbO$_3$ material 122, the electrodes 108a, 108b, and the cladding layers 124a, 124b may be disposed on a Silicon (Si) substrate 126. While not shown, the waveguide structure of the first arm 106a of the modulator 100 may be configured similar to the waveguide structure of the second arm 106b. For example, the waveguide structure of the first arm 106a may be defined by directly patterning a slab of LiNbO$_3$ material 122, surrounding the patterned slab of LiNbO$_3$ material 122 by SiO$_2$ cladding layers 124a, 124b, and disposing the structure on a Si substrate 126, optionally the same Si substrate 126 used in the waveguide structure of the second arm 106b.

Figure 1C:
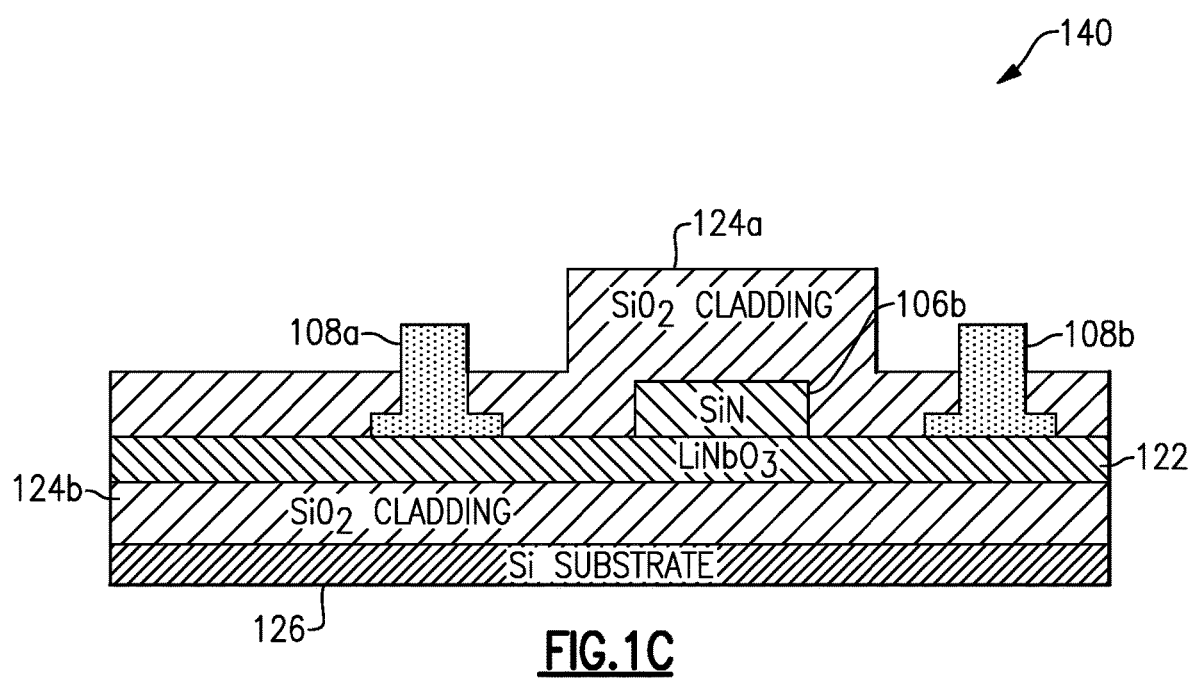
FIG. 1C is a diagram illustrating a cross-sectional view of a photonic modulator.

In some examples, the waveguide structures 106a, 106b may be configured differently. For example, FIG. 1C illustrates a cross sectional view of a modulation section 140 of an MZI modulator (e.g., modulator 100). In one example, the modulation section 140 may be substantially the same as the modulation section 120 of FIG. 1B, except the waveguide structure of the second arm 106b is configured differently. As shown, the waveguide structure of the second arm 106b is defined by patterning a Silicon Nitride (SiN) film on the slab of LiNbO$_3$ material 122. Likewise, the waveguide structure of the first arm 106a may be configured similarly.

As discussed above, when operating photonic modulators such as the modulator 100 at high frequencies (e.g., above 100 GHz), RF parasitic effects (e.g., signal reflection, propagation loss, electromagnetic interference, etc.) can degrade performance. In some implementations, such modulators can be designed with a miniaturized form (e.g., relative to wavelength) to suppress RF parasitic effects within the modulator. However, reducing the size of the modulator can increase the modulation voltage required to achieve the desired phase shift (e.g., 180°). In addition, the distance between voltage circuitry configured to apply the modulation voltage to the electrode(s) and the modulator may contribute to additional RF loss and/or reflections.

A compact, high-frequency photonic modulator arrangement is provided herein. In at least one embodiment, a photonic modulator is integrated with a III-Nitride electronic device. More specifically, the photonic modulator is bonded to the electronic device substrate to reduce RF parasitic effects between the devices and enable high frequency operation of the modulator (e.g., above 100 GHz).

Figure 2:
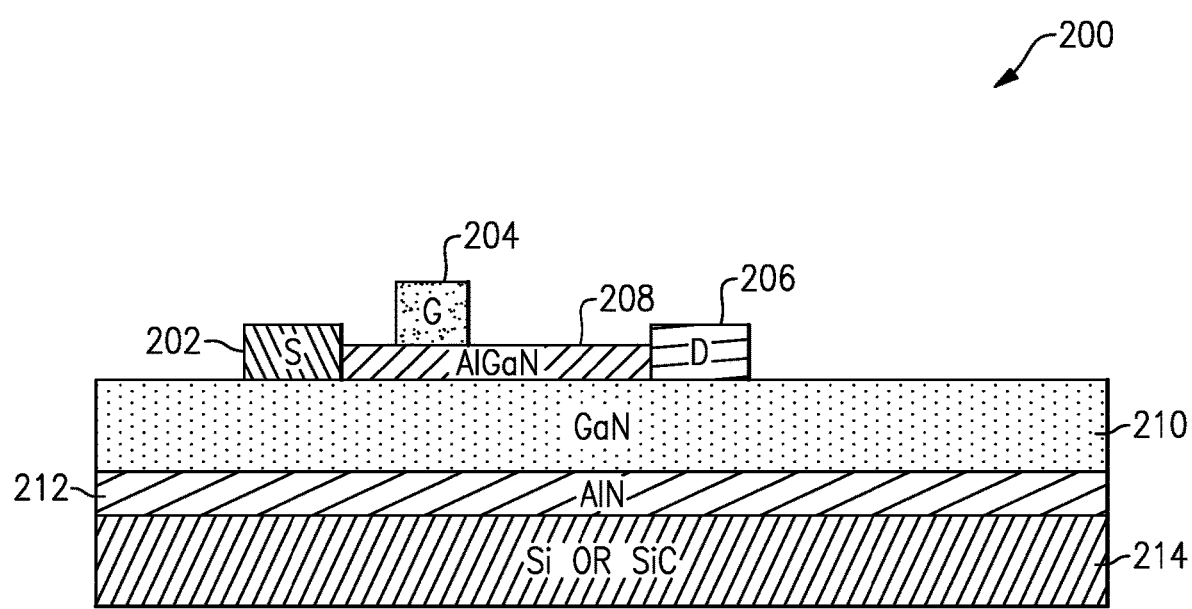
FIG. 2 is a diagram illustrating a cross-sectional view of a III-Nitride electronic device.

As discussed above, photonic modulators used in high frequency applications may operate with an increased modulation voltage. As such, voltage circuitry configured to provide the modulation voltage to the electrode(s) of the modulator may include semiconductor devices capable of providing large voltages without entering a breakdown region at high frequencies. In one example, the voltage circuitry may include one or more III-Nitride electronic devices. For example, the voltage circuitry may include one or more Gallium Nitride (GaN) High-Electron-Mobility Transistors (HEMT) to provide the increased modulation voltage. As known to those skilled in the art, GaN HEMTs can provide high breakdown voltages while operating at high frequencies (e.g., above 100 GHz). In some examples, GaN HEMTs can be utilized to provide low noise amplification. FIG. 2 illustrates a cross sectional view of an example of a GaN HEMT 200. As shown, the GaN HEMT 200 includes a source 202, a gate 204, and a drain 206. In one example, an Aluminum Gallium Nitride (AlGaN) barrier layer 208 is included between the source 202, the gate 204, and the drain 206. In other examples, the barrier layer 208 can be made from InAlN, InAlGaN, or ScAlN materials. The source 202 and the drain 206 are fixed to a GaN channel layer 210 and an Aluminum Nitride (AlN) nucleation (or buffer) layer 212 is disposed between the GaN channel layer 210 and a substrate 214. In some examples, the substrate 214 may be made from Si; however, in other examples the substrate may be made from a Silicon Carbide (SiC) material.

Figure 3:
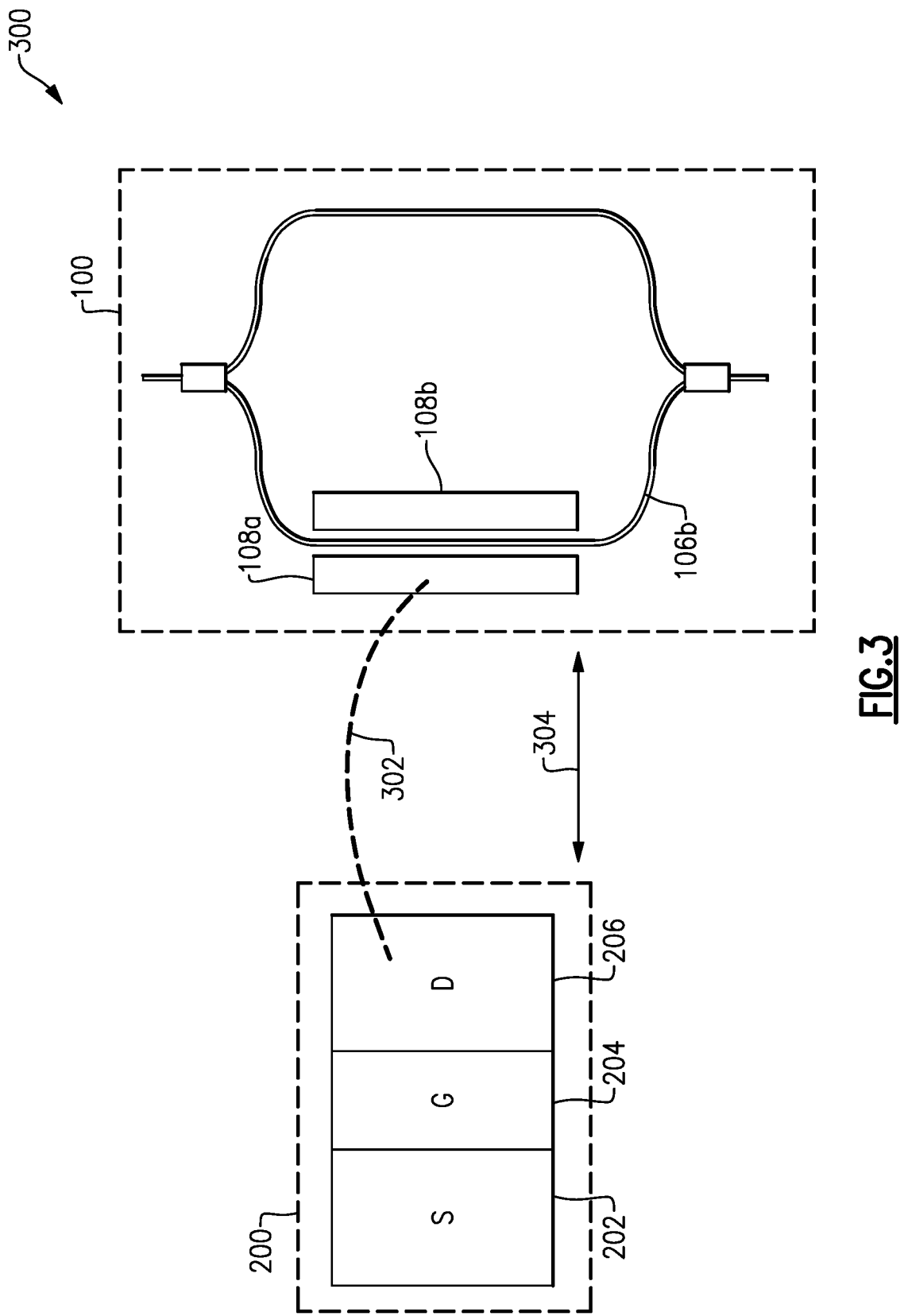
FIG. 3 is a diagram illustrating an electro-optical modulator arrangement according to one embodiment.

FIG. 3 illustrates an electro-optical modulator arrangement 300 in accordance with aspects described herein. In one example, the GaN HEMT 200 of FIG. 2 is coupled to the modulator 100 of FIG. 1A. As shown, the drain 206 of the GaN HEMT 200 is coupled to the electrode 108a of the modulator 100 via a metal connection 302. The GaN HEMT 200 is configured to provide a modulation voltage via the drain 206 to the electrode 108a to modulate the optical energy of the second arm 106b. In some examples, the electrode 108b may be coupled to ground or another voltage source. While not shown, the GaN HEMT 200 may be configured to operate with other circuitry to provide the modulation voltage to the electrode 108a. For example, an RF modulation source may be coupled to the gate 204 and the source 202 may be coupled to ground or another voltage source. As such, the RF modulation source may provide an RF signal to the gate 204 to turn the GaN HEMT 200 on and off, providing the modulation voltage at the drain 206 corresponding to the RF signal. In some examples, the GaN HEMT 200 may be configured to amplify the modulation voltage provided at the drain 206.

In one example, the distance 304 represents a physical distance between the drain 206 and the electrode 108a. As such, the electrical length of the metal connection 302 may correspond to the distance 304. As discussed above, the distance between the voltage circuitry (i.e., the GaN HEMT 200) and the modulator 100 may contribute to parasitic RF loss. As such, reducing the distance 304 between the drain 206 and the electrode 108a may improve performance of the modulator 100.

Figure 4:
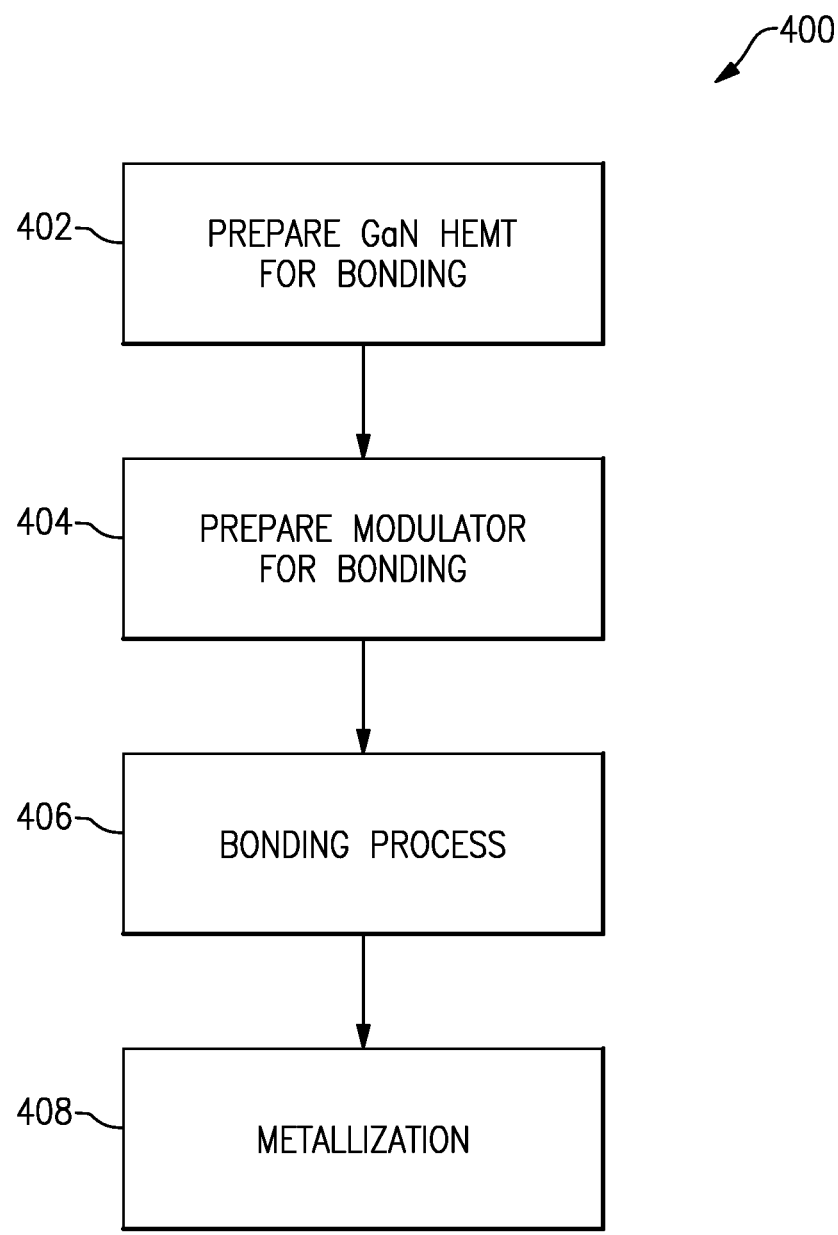
FIG. 4 is a flow chart illustrating a method for manufacturing an electro-optical modulator assembly according to one embodiment.

FIG. 4 illustrates a method 400 of manufacturing an electro-optical modulator assembly in accordance with aspects described herein. In one example, the electro-optical modulator assembly corresponds to a photonic modulator integrated with an electronic device. For example, the electro-optical modulator assembly may correspond to the electro-optical modulator arrangement 300 of FIG. 3. In some examples, the method 400 may allow for the distance 304 between the GaN HEMT 200 and the modulator 100 to be reduced, improving performance of the modulator 100 at high frequencies.

Figure 5A:
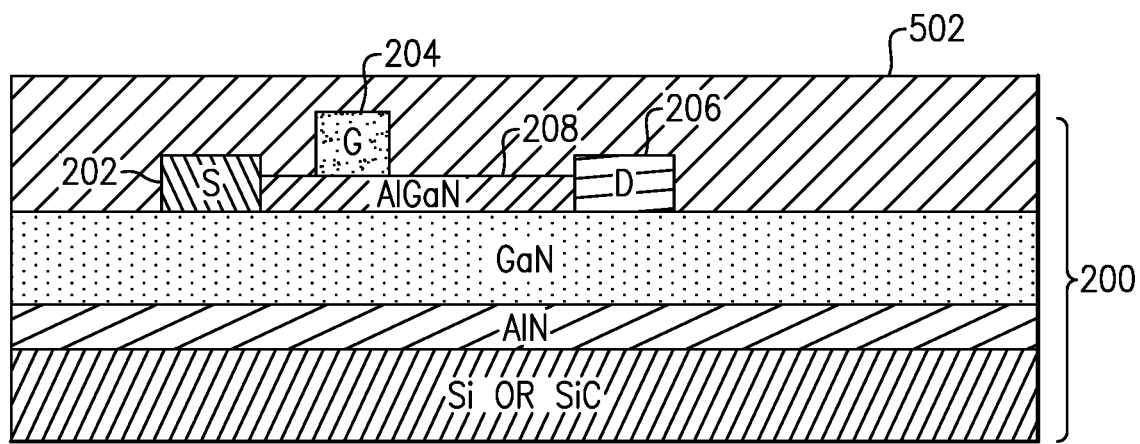
FIG. 5A is a diagram illustrating a cross-sectional view of a III-Nitride electronic device according to one embodiment.

In one example, the method 400 includes bonding the modulator 100 to the GaN HEMT 200 using an oxide-oxide bonding process. As such, at block 402, the GaN HEMT 200 is prepared for the oxide-oxide bonding process. As shown in FIG. 5A, an $SiO_2$ layer 502 is deposited over the GaN HEMT 200. In some examples, the thickness of the $SiO_2$ layer 502 may correspond to the thickness of certain features of the GaN HEMT 200. For example, the $SiO_2$ layer 502 may be thick enough to cover metal contacts corresponding to the source 202, the gate 204, and the drain 206 of the GaN HEMT 200. In certain examples, a planarization process may be utilized to flatten the top of the $SiO_2$ layer 502.

Figure 5B:
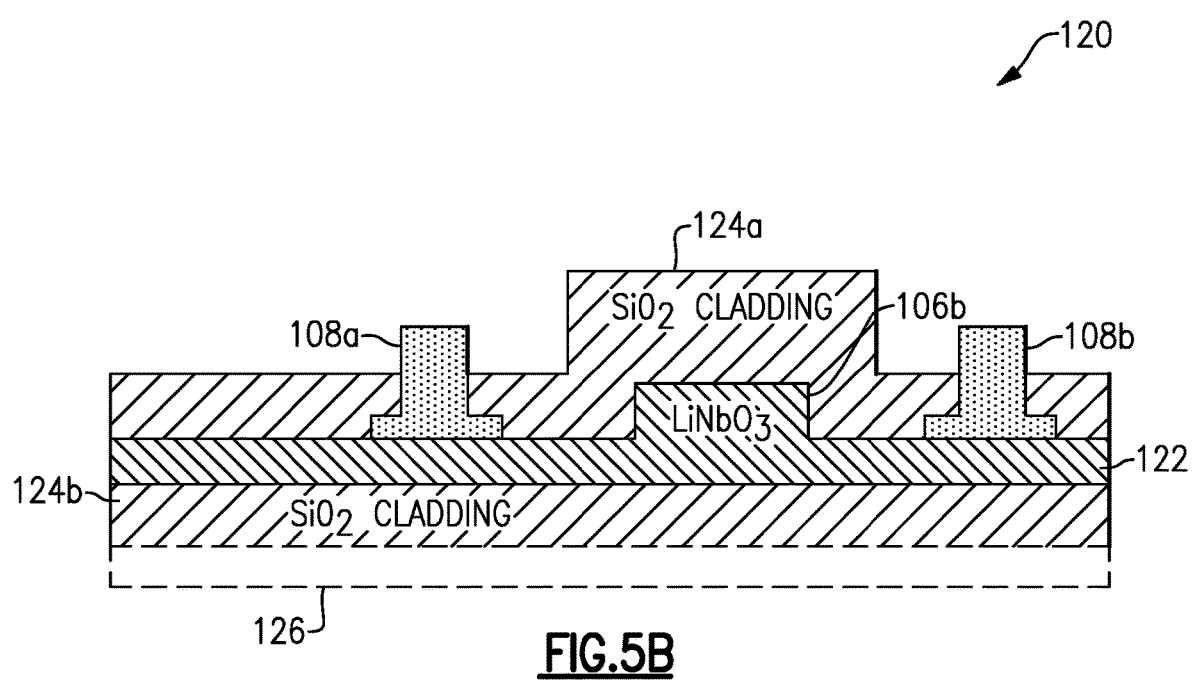
FIG. 5B is a diagram illustrating a cross-sectional view of a photonic modulator according to one embodiment.

Similarly, at block 404, the modulator 100 is prepared for the oxide-oxide bonding process. In one example, the Si substrate 126 of the modulator 100 may be removed to expose the $SiO_2$ cladding layer 124b. FIG. 5B illustrates the modulation section 120 of the modulator 100 with the Si substrate 126 removed. In some examples, the Si substrate 126 may be removed using plasma processing and/or a back-grinding process. Alternatively, in other examples, a thin $SiO_2$ layer may be deposited on the back (i.e., bottom) of the Si substrate 126. In some examples, it may be preferred to remove the Si substrate 126 to maintain or improve performance of the modulator 100 at high frequencies (e.g., above 100 GHz). While not shown, in other examples, the modulator 100 may be configured with the modulation section 140 of FIG. 1C and may be modified in a similar manner.

Figure 5D:
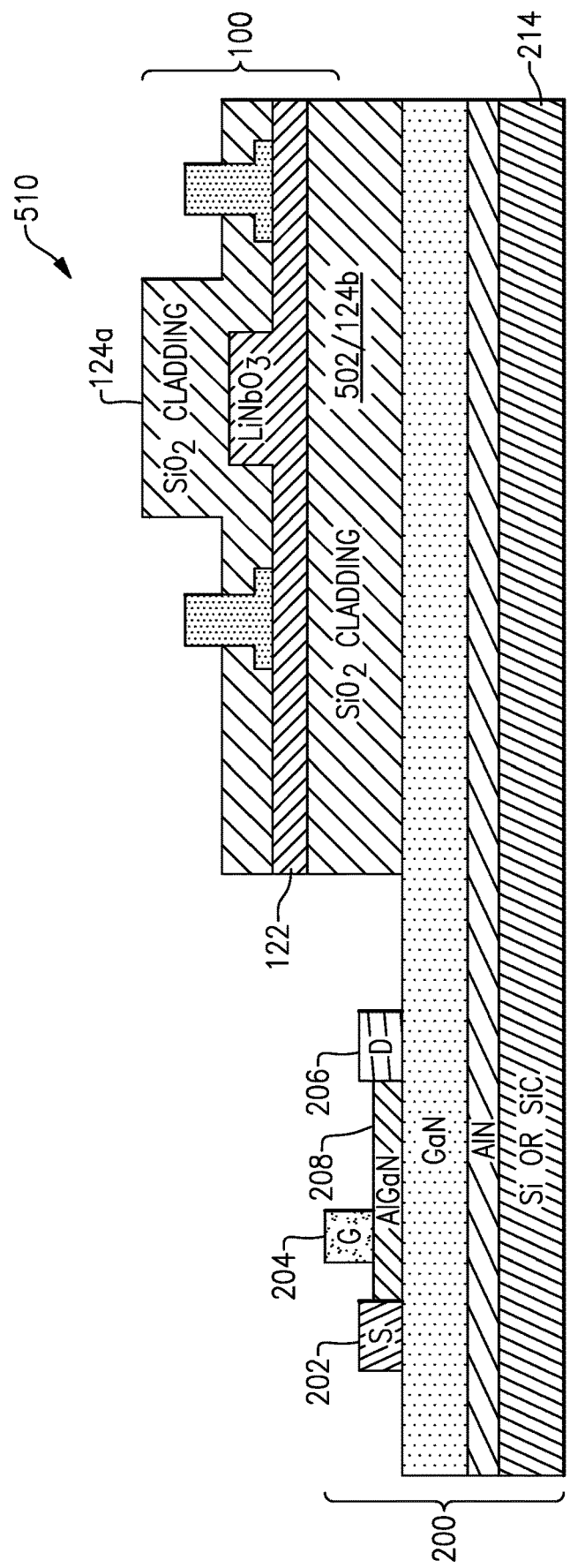
FIG. 5D is a diagram illustrating a cross-sectional view of a III-Nitride electronic device integrated with a photonic modulator according to one embodiment.

At block 406, the modulator 100 is integrated onto the substrate 214 of the GaN HEMT 200. As shown in FIG. 5C, the $SiO_2$ cladding layer 124b of the modulator 100 is bonded to the $SiO_2$ layer 502 of the GaN HEMT 200 using an oxide-oxide bonding process to produce an integrated device 510. In one example, the area (e.g., layers) above the GaN HEMT 200 may be removed to provide access to the source 202, the gate 204, and the drain 206. For example, as shown in FIG. 5D, portions of the layers 122, 124a, 124b, and 502 above the source 202, the gate 204, and the drain 206 may be removed from the integrated device 510 using a lithography and/or etching process. In other examples, the portion of the $SiO_2$ layer 502 covering the source 202, gate 204, and drain 208 of the GaN HEMT 200 may be removed prior to the oxide-oxide bonding process (e.g., prior to block 406) such that the source 202, gate 204, and drain 208 of the GaN HEMT 200 remain exposed post-bond.

Figure 5E:
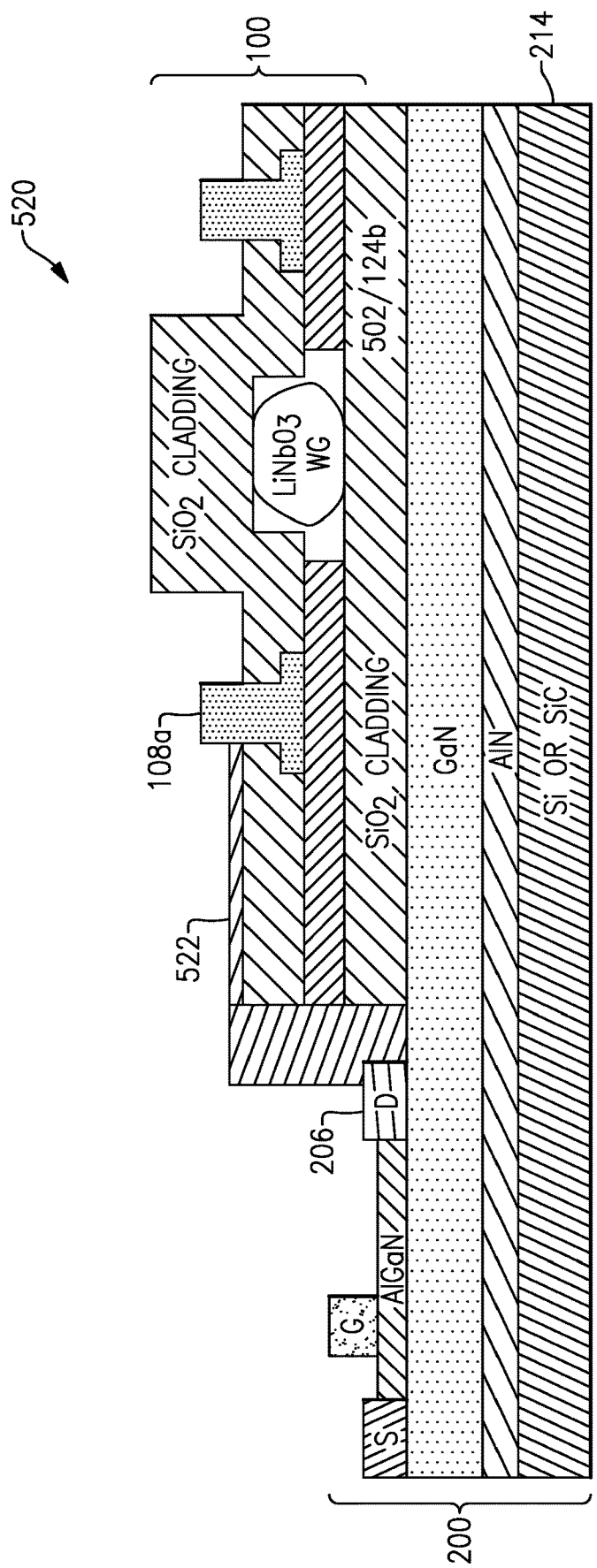
FIG. 5E is a diagram illustrating a cross-sectional view of an electro-optical modulator assembly according to one embodiment.

At block 408, a metallization process is applied to the integrated device 510. As shown in FIG. 5E, the metallization process may be utilized to produce a metal connection 522 between the GaN HEMT 200 and the modulator 100 to provide an electro-optical modulator assembly 520. In one example, the metal connection 522 may correspond to the metal connection 302 of FIG. 3. The metal connection 522 may couple the drain 206 of the GaN HEMT 200 to the electrode 108a of the modulator 100. In some examples, the metallization process may include a lithography and/or a metal lift-off process to connect the drain 206 to the electrode 108a. While not shown, in other examples, a similar process may be utilized to couple the electrode 108b to ground or a different voltage source.

In some examples, by bonding the modulator 100 to the substrate 214 of GaN HEMT 200, the modulator 100 can be arranged in close proximity (e.g., microns) to the GaN HEMT 200. Being that the modulator 100 and the GaN HEMT 200 are in close proximity, the length of the metal connection 522 may be relatively short and the distance between the drain 206 of the GaN HEMT 200 and the electrode 108a (e.g., the distance 304) may be reduced significantly. As such, RF parasitic effects associated with the electrical connection between the modulator 100 and the GaN HEMT 200 can be reduced, and the modulator 100 may be enabled to operate at even higher frequencies (e.g., THz range).

It should be appreciated that embodiments described herein are not limited to a particular type of III-Nitride electronic device. As described above, a GaN HEMT can be integrated with a photonic modulator to provide improved high frequency performance; however, in other examples, different III-Nitride materials and/or devices may be utilized. For example, depending on the implementation, the method 400 may be adapted to integrate an Indium Nitride (InN) HEMT with the photonic modulator (e.g., depositing $SiO_2$ on top of the InN HEMT for bonding). In alternative embodiments, devices other than III-Nitride devices, such as GaAs, InP, SiC, and Si based devices, may be integrated with photonic modulators depending on the performance requirements for specific applications. In addition, in some examples, the method 400 may be carried out using individual devices (i.e., chips); however, in other examples, the method 400 may be carried out at the wafer-level.

Likewise, it should be appreciated that embodiments described herein are not limited to a specific type of photonic modulator. While the use of an MZI modulator is described above, in other examples, III-Nitride electronic devices can be integrated with different types of modulators (e.g., a resonator modulator).

Accordingly, various aspects and examples described herein provide a compact, high-frequency photonic modulator arrangement. In at least one embodiment, a photonic modulator is integrated with an III-Nitride electronic device. More specifically, the photonic modulator is bonded to the electronic device substrate to reduce RF parasitic effects between the devices and enable high frequency operation of the modulator (e.g., above 100 GHz).

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A method of manufacturing an electro-optical modulator assembly, the method comprising:
   providing a transistor including a gate, a drain, and a source disposed on a first substrate;
   providing a photonic modulator including a first waveguide structure positioned between a first electrode and a second electrode, the photonic modulator being disposed on a second substrate;
   depositing a first oxide layer over the gate, the drain, and the source of the transistor; and
   bonding the first oxide layer of the transistor to a second oxide layer of the photonic modulator such that the photonic modulator is integrated with the transistor on the first substrate and the photonic modulator is disposed over a film forming a channel layer for the transistor, the photonic modulator occupying an area that is non-overlapping with an area occupied by the transistor.

2. The method of claim 1, wherein bonding the first oxide layer of the transistor to the second oxide layer of the photonic modulator further incudes removing the second substrate to expose the second oxide layer of the photonic modulator.

3. The method of claim 2, wherein the second substrate is removed using plasma processing and/or a back-grinding process.

4. The method of claim 1, wherein bonding the first oxide layer of the transistor to the second oxide layer of the photonic modulator further incudes depositing the second oxide layer on a bottom side of the second substrate.

5. The method of claim 1, further comprising:
   removing a portion of the first oxide layer to expose the gate, the drain, and the source of the transistor; and
   providing a metal connection between the transistor and the photonic modulator to couple the drain of the transistor to one of the first and second electrodes of the photonic modulator.

6. The method of claim 5, wherein the portion of the first oxide layer is removed using a lithography process and/or an etching process.

7. The method of claim 5, wherein the metal connection is provided between the transistor and the photonic modulator using a lithography process and/or a metal lift-off process.

8. The method of claim 1, wherein the transistor is a III-Nitride transistor.

9. The method of claim 8, wherein the transistor is a Gallium Nitride (GaN) High-Electron-Mobility Transistor (HEMT).

10. The method of claim 1, wherein the first substrate is one of a Silicon (Si) substrate and a Silicon Carbide (SiC) substrate.

11. The method of claim 1, wherein the photonic modulator is configured as a Mach-Zehnder interferometer (MZI) modulator and includes a second waveguide structure positioned outside the first and second electrodes.

12. The method of claim 11, wherein the first and second waveguide structures are fabricated from at least one of Lithium Niobate ($LiNbO_3$) and Silicon Nitride (SiN) and configured to propagate optical energy.

* * * * *